US008327215B2

(12) United States Patent
Yoon et al.

(10) Patent No.: US 8,327,215 B2
(45) Date of Patent: Dec. 4, 2012

(54) APPARATUS AND METHOD FOR ENCODING LDPC CODE USING MESSAGE PASSING ALGORITHM

(75) Inventors: Chanho Yoon, Daejon (KR); Jung-Bo Son, Daejon (KR); Hun-Sik Kang, Daejon (KR); Sok-Kyu Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1120 days.

(21) Appl. No.: 12/208,006

(22) Filed: Sep. 10, 2008

(65) Prior Publication Data

US 2009/0158113 A1   Jun. 18, 2009

(30) Foreign Application Priority Data

Dec. 13, 2007   (KR) .................. 10-2007-0129973
Apr. 18, 2008   (KR) .................. 10-2008-0036084

(51) Int. Cl.
*G06F 11/00*   (2006.01)
(52) U.S. Cl. ..................................... 714/752
(58) Field of Classification Search .............. 714/752
See application file for complete search history.

(56) References Cited

U.S. PATENT DOCUMENTS

| 6,961,888 B2 | 11/2005 | Jin et al. | |
| 7,178,082 B2* | 2/2007 | Yu et al. | 714/752 |
| 2005/0257124 A1* | 11/2005 | Richardson et al. | 714/796 |
| 2010/0107033 A1* | 4/2010 | Kuri et al. | 714/752 |
| 2010/0192044 A1* | 7/2010 | Bai et al. | 714/763 |

FOREIGN PATENT DOCUMENTS

| KR | 10-2003-0095144 A | 12/2003 |
| KR | 10-2005-0035729 | 4/2005 |
| KR | 10-2006-0061145 | 6/2006 |
| KR | 10-2007-0084950 A | 8/2007 |

OTHER PUBLICATIONS

Thomas J. Richardson et al, "Efficient Encoding of Low-Density Parity-Check Codes", IEEE Transactions on Information Theory, Feb. 2001, pp. 638-656, vol. 47, No. 2.

* cited by examiner

*Primary Examiner* — Scott Baderman
*Assistant Examiner* — Yair Leibovich
(74) *Attorney, Agent, or Firm* — Kile Park Goekjian Reed & McManus PLLC

(57) ABSTRACT

Provided is an apparatus and method for encoding a Low Density Parity Check (LDPC) code using a message passing algorithm. The apparatus, includes: a parity calculating unit for operating a check node value on an input bit and a predetermined parity bit according to the message passing algorithm and calculating a parity bit; a parity correcting unit for correcting the calculated parity bit according to a parity check result of the calculated parity bit; and an output transform unit for combining the input bit and the corrected parity bit.

17 Claims, 13 Drawing Sheets

Input bit part (456bit) — Parity bit part (456bit)

H =

| 13 | 21 | 36 |    | 32 |    |    |    | 4  |    |    | 0  | 0  |    |    |    |    |    |    |    |    |    |    |    |
|----|----|----|----|----|----|----|----|----|----|----|----|----|----|----|----|----|----|----|----|----|----|----|----|
| 15 | 26 | 27 |    |    |    |    | 9  |    |    | 18 |    | 0  | 0  |    |    |    |    |    |    |    |    |    |    |
| 0  | 19 | 2  |    | 12 |    | 26 |    |    |    |    | 3  |    | 0  | 0  |    |    |    |    |    |    |    |    |    |
| 2  | 17 | 21 |    |    | 16 |    |    |    | 11 |    |    |    |    | 0  | 0  |    |    |    |    |    |    |    |    |
| 37 | 3  | 5  |    |    |    | 31 |    | 36 |    | 6  |    |    |    |    | 0  | 0  |    |    |    |    |    |    |    |
| 26 | 25 | 1  |    |    |    |    | 7  |    |    |    | 24 |    |    |    |    | 0  | 0  |    |    |    |    |    |    |
| 32 | 27 | 24 |    |    | 17 |    |    |    |    |    |    | 0  |    |    |    |    | 0  | 0  |    |    |    |    |    |
| 36 | 15 | 15 | 31 |    |    | 13 |    |    | 8  |    |    |    |    |    |    |    |    | 0  | 0  |    |    |    |    |
| 33 | 5  | 10 |    | 35 |    |    |    |    |    | 28 |    |    |    |    |    |    |    |    | 0  | 0  |    |    |    |
| 3  | 29 | 11 | 30 |    | 30 |    |    |    |    |    | 16 |    |    |    |    |    |    |    |    | 0  | 0  |    |    |
| 19 | 19 | 29 |    |    |    |    |    | 27 | 20 |    |    |    |    |    |    |    |    |    |    |    | 0  | 0  |    |
| 2  | 36 | 28 | 33 |    |    |    | 17 |    |    |    |    | 0  |    |    |    |    |    |    |    |    |    |    | 0  |

Cyclic shift 0

Cyclic shift 2

APPARATUS AND METHOD FOR ENCODING LDPC CODE USING MESSAGE PASSING ALGORITHM

CROSS-REFERENCE(S) TO RELATED APPLICATIONS

The present invention claims priority of Korean Patent Application Nos. 10-2007-0129973 and 10-2008-0036084, filed on Dec. 13, 2007 and Apr. 18, 2008, which are incorporated herein by reference.

BACKGROUND OF THE INVENTION

1. Field of the Invention

The present invention relates to an apparatus and method for encoding a Low Density Parity Check (LDPC) code using a message passing algorithm; and, more particularly, to an apparatus and method for encoding an LDPC code which can reduce hardware complexity of a complicated encoding apparatus and perform encoding at high-speed by designating a predetermined parity bit and calculating a check node value and a parity bit using a message passing algorithm where offset of an LDPC code decoding procedure is applied.

This work was supported by the IT R&D program for MIC/IITA [2006-S-002-02, "IMT-Advanced Radio Transmission Technology with Low Mobility"].

2. Description of Related Art

There are some cases that a signal transmitted in a digital format cannot be demodulated in a receiving end according to the state of a channel in a wired/wireless communication system. These cases are caused by an error incident rate increasing due to a high-speed wired/wireless communication. Diverse techniques are applied to reduce the error incident rate and a channel coding technique is representatively applied.

Recently, the channel coding technique is applied to most wireless communication systems. In particular, a Low Density Parity Check (LDPC) code has a great attention from people as a next generation channel codec in the wireless communication system.

First of all, it is assumed that the LDPC code is encoded according to a systematic method. That is, the systematic method means that a part of a packet is output in the same format as an input bit. Also, a rest part of the packet has a format that additional information corresponding to the parity bit is sequentially added. Accordingly, when the input bit is completely input in a block in charge of encoding function, encoding is performed. A rate that the parity bit takes in the entire packet is differed according to a code rate. Accordingly, the code rate is fixed by an H matrix.

Meanwhile, there is an LDPC code encoding method suggested by "Richardson" as a related art of the LDPC code encoding method. The related art includes the steps of segmenting the H matrix, dividing the H matrix into sub matrixes, and creating an output parity bit when an input vector of simultaneous equations of the matrix is given.

An LDPC code encoding method simpler than the LDPC code encoding method suggested by "Richardson" is suggested by "Motorola Inc." in "Institute of Electrical and Electronics Engineers (IEEE) 802.16e". In the LDPC code encoding method, the matrix is not operated but the LDPC code is encoded by directly acquiring a parity bit through simultaneous equations.

The LDPC code encoding method has problems that it is difficult to process a signal at high-speed due to an operation of dividing a sub-matrix. Also, the LDPC code encoding method of "Motorola Inc." has a problem that encoding complexity increases by directly acquiring the parity bit and the hardware resource load remarkably increases.

There is another conventional LDPC code encoding method for organizing an H matrix and encoding a new LDPC code based on the reorganized H matrix. This conventional encoding method defines and encodes the new H matrix by largely changing the conventional H matrix. That is, the parity check matrix is newly defined but a structure is not a generalized conventional dual diagonal structure.

This conventional encoding method can create a new code by performing encoding based on the new H matrix. However, this conventional encoding method has a problem that a complex matrix operation should be performed.

SUMMARY OF THE INVENTION

An object of the present invention is to solve the problems of conventional technologies that encoding complexity increases and hardware resource load remarkably increases.

An embodiment of the present invention is directed to providing an apparatus and method for encoding an LDPC code which can reduce hardware complexity of a complicated encoding apparatus and perform encoding at high-speed by designating a predetermined parity bit and calculating a check node value and a parity bit using a message passing algorithm where offset of an LDPC code decoding procedure is applied.

The objects of the present invention are not limited to the above-mentioned ones. Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In order to solve the above problem, the present invention designates a predetermined parity bit and calculates a check node value and a parity bit using a message passing algorithm where offset of an LDPC code decoding procedure is applied.

In accordance with an aspect of the present invention, there is provided an apparatus for encoding a Low Density Parity Check (LDPC) code using a message passing algorithm, including: a parity calculating unit for operating a check node value on an input bit and a predetermined parity bit according to the message passing algorithm and calculating a parity bit; a parity correcting unit for correcting the calculated parity bit according to a parity check result of the calculated parity bit; and an output transform unit for combining the input bit and the corrected parity bit.

In accordance with another aspect of the present invention, there is provided a method for encoding an LDPC code using a message passing algorithm, including: operating a check node value on an input bit and a predetermined parity bit according to a message passing algorithm and calculating a parity bit; correcting the calculated parity bit according to a parity check result of the calculated parity bit; and combining the input bit and the corrected parity bit.

In addition, the method of the present invention further includes transforming a format of the input bit into a decimal format having a code, where in said combining the input bit and the corrected parity bit, the combined parity bit is transformed into a parity bit of a binary format.

BRIEF DESCRIPTION OF THE DRAWINGS

FIG. 4 shows an H matrix where the parity bit parts on the H matrix of FIG. 2 are set up as "0" in accordance with an embodiment of the present invention.

DESCRIPTION OF SPECIFIC EMBODIMENTS

The advantages, features and aspects of the invention will become apparent from the following description of the embodiments with reference to the accompanying drawings, which is set forth hereinafter. Therefore, those skilled in the field of this art of the present invention can embody the technological concept and scope of the invention easily. In addition, if it is considered that detailed description on a related art may obscure the points of the present invention, the detailed description will not be provided herein. The preferred embodiments of the present invention will be described in detail hereinafter with reference to the attached drawings.

The present invention performs encoding using a message passing algorithm applied in a Low Density Parity Check (LDPC) code decoding apparatus differently from a conventional encoding method. The LDPC code encoding apparatus in accordance with the present invention designates a predetermined parity bit value in advance and checks a parity bit of the designated value through simultaneous equations. The LDPC code encoding apparatus acquires a final parity bit in parallel or in serial through the check result. It is assumed that the LDPC code encoding apparatus adopts an offset minimum encoding technique.

The present invention performs LDPC code encoding by using a message passing algorithm in decoding. This is proper to high-speed communication and is capable of minimize encoding complexity and resource consumption.

Figure 1:
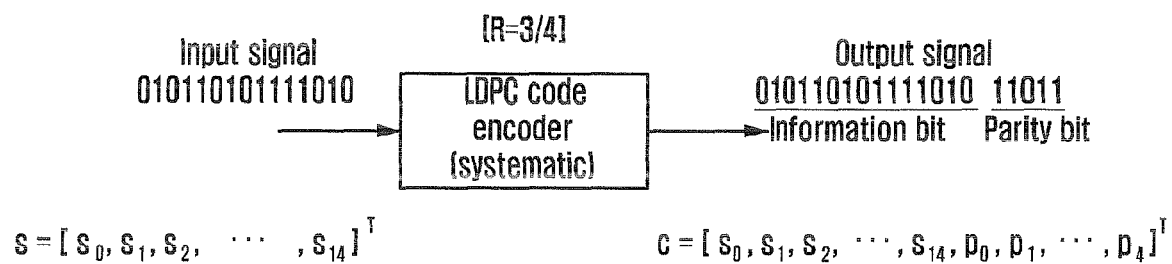
FIG. 1 shows a scheme on general LDPC code encoding.

FIG. 1 shows a scheme on general LDPC code encoding.

Basic concept of an LDPC code encoding technique is "H matrix". A packet encoded through an H matrix in an encoder of a transmitting end is decoded through the H matrix in a decoder of a receiving end.

An LDPC code encoder of a code rate "R=3/4" is shown in FIG. 1. As shown in FIG. 1, a 15-bit binary vector as an input signal is output as an output signal. 5 parity bits are determined by the LDPC code encoder based on the input vector and are output together as an output signal. For example, a code rate is "R=3/4" as "input bit[15]/output bit[20]=3/4".

A structure of the H matrix suggested in the present invention will be described with reference to FIGS. 2 to 8.

Figure 2:
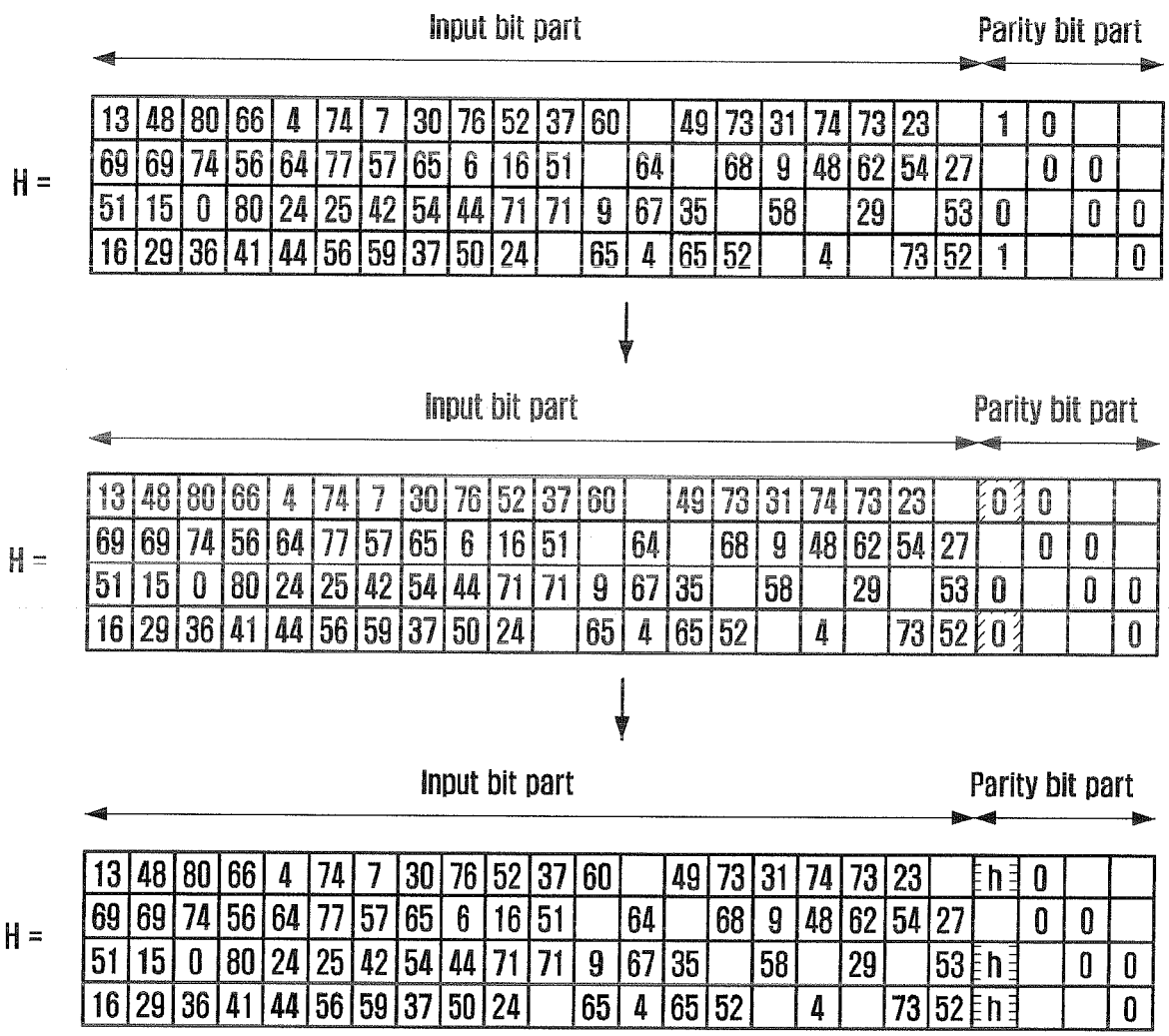
FIG. 2 shows the H matrix used in the present invention.

FIG. 2 shows the H matrix used in the present invention. An upper part of FIG. 2 shows the H matrix used in the present invention. Middle and lower parts of FIG. 2 show the H matrix suggested in the present invention.

Figure 3:
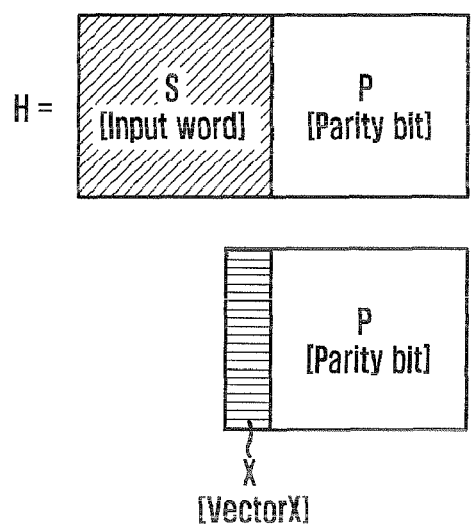
FIG. 3 shows a concept that an input word is transformed in a vector X in accordance with an embodiment of the present invention.

FIG. 3 shows a concept that an input word is transformed in a vector X in accordance with an embodiment of the present invention.

FIG. 4 shows an H matrix where the parity bit parts on the H matrix of FIG. 2 are set up as "0" in accordance with an embodiment of the present invention. The H matrix has a structure that a code rate is "R=1/2" and a sub-block size is 38×38.

Figure 5:
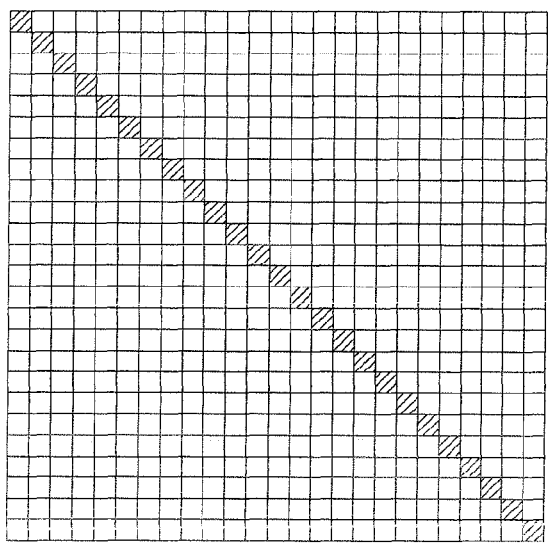
FIG. 5 shows a concept on cyclic shift used in the present invention.
Figure 5:
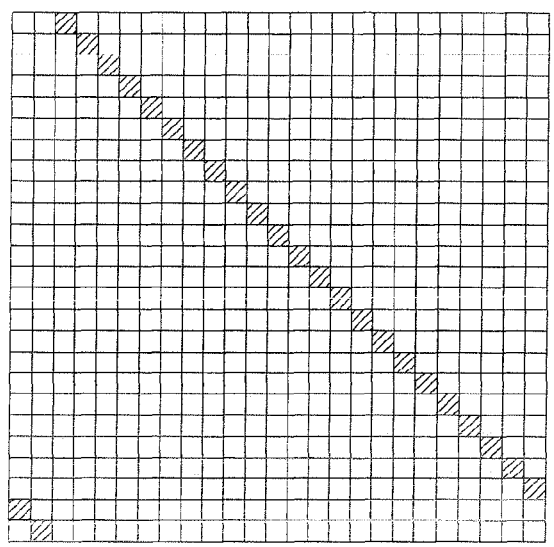

FIG. 5 shows a concept on cyclic shift used in the present invention. A cyclic shift 0 is shown in a left side of FIG. 5 and a cyclic shift 2 is shown in a right side of FIG. 5.

FIG. 2 shows the H matrix applied to the LDPC code encoder including cyclic shift of a projection matrix. When a $1^{st}$ matrix of a parity bit region on the general H matrix shown in the upper part of FIG. 2 is changed as shown in the general H matrix shown in the middle and lower parts of FIG. 2, it becomes the H matrix suggested in the present invention.

For example, a structure of the H matrix of a code rate "R=5/6" suggested in a reference of "IEEE 802.11n" under standardization is shown in the upper part of FIG. 2. This H matrix includes a matrix of a sub-block identity of an 81×81 size. A number on the H matrix shows a cyclic shift value.

FIG. 4 shows an example of the cyclic shift in the H matrix of the 38×38 sub-block size. Each sub-block has a structure of a circulant matrix.

When the sub-block identity on the H matrix shown in FIG. 3 is 81×81, an H matrix size of FIG. 3 is 324×1944. In particular, the H matrix shown in FIG. 3 has a structure of an H matrix suggested by "Richardson". This H matrix can be divided into an input bit part and a parity bit part as shown in FIG. 2. The H matrix has a characteristic that a parity bit part, i.e., a parity bit check matrix P, is formed of a dual diagonal structure. The parity bit check matrix P is called a parity bit part or a parity part matrix hereinafter.

As described above, the structure of the H matrix suggested in the present invention has a characteristic that the parity bit parts are formed as a cyclic shift 0, e.g., an identity matrix, as shown in the middle part of FIG. 2, and a parity bit corresponding to the length of the diagonal part of the sub-block is determined at a time in parallel as shown in the lower part of FIG. 2.

Before describing algorithm for determining the parity bit in parallel at a time on the basis of the sub-block identity, a procedure of determining the parity bit of the bit identity will be described hereinafter with reference to FIG. 4.

As shown in FIG. 4, in the H matrix of the code rate "R=1/2", parts expressed as "▨" in the parity bit part are corrected into 0 cyclic shift. A result acquired by multiplying the H matrix by a code word vector c encoded by the H matrix should satisfy Equation 1.

$$H \cdot c^T = 0 \qquad \text{Eq. 1}$$

In Equation 1, a c vector represents an output vector c of the LDPC code encoder shown in FIG. 1.

The LDPC code encoder determines an underlined parity bit among the output vectors shown in FIG. 1. That is, the LDPC code encoder can acquire 456 parity bits satisfying "$HC^T=0$" on the H matrix shown in FIG. 4 since the number of sub-blocks is 38, i.e., 38*12=456.

As described above, the H matrix of FIG. 4 includes matrixes of the sub-block identity and the sub-block identity matrix includes cyclic shift shown in FIG. 5.

A procedure of acquiring the 456 parity bits is as follows. Each of the 456 parity bits is defined as "$P_0, P_1, \ldots, P_{454}, P_{455}$".

When the summation of input bits corresponding to a $1^{st}$ row, a $13^{th}$ row, a $59^{th}$ row, an $112^{th}$ row, an $184^{th}$ row, and a $308^{th}$ row among 456 rows and parity bits corresponding to a $0^{th}$ row and a $38^{th}$ row is 0, a parity bit $P_0$ and a parity bit $P_1$ satisfy Equation 1. That is, the summation should be an even number as a modulo 2 operation. An "$HC^T=0$" operation to the $1^{st}$ row is expressed as Equation 2.

$$(H)_{j=0} \cdot c^T = s_{13} \oplus s_{59} \oplus s_{112} \oplus s_{184} \oplus s_{308} \oplus p_0 \oplus p_{38} = 0 \qquad \text{Eq. 2}$$

In Equation 2, "⊕" represents a bit operation, i.e., a modulo 2 operation, and means that the operation of the LDPC code encoding procedure is the operation of the bit identity. Also, $(H)_j$ represents a $j^{th}$ row of the H matrix.

As shown in Equation 2, $S_0$, $S_{59}$, $S_{112}$, $S_{184}$, and $S_{308}$ are given as input signals but parity bits $P_0$ and $P_{38}$ should be calculated. 456 parity bits exist on the H matrix shown in FIG. 4. Each value of the 456 parity bits "$P_0, P_1, \ldots, P_{454}, P_{455}$" should be acquired for the solution of Equation 2.

However, the solution of the 456 parity bits is not acquired through simultaneous equations. The present invention considers that when a specific parity bit value is set up in advance, another parity bit value can be acquired. Accordingly, an initial value of a parity bit $P_0$ is set up as 0 and a corresponding parity bit $P_{38}$ value is acquired. For example, since the parity bit $P_{38}$ value is already figured out, a parity bit $P_{76}$ value corresponding to the $38^{th}$ row of the H matrix is acquired as shown in Equation 3.

$$(H)_{j=38} \cdot c^T = s_{15} \oplus s_{64} \oplus s_{113} \oplus s_{275} \oplus s_{398} \oplus p_{38} \oplus p_{76} = 0 \qquad \text{Eq. 3}$$

As shown in Equation 3, the parity bit $P_{76}$ is located in a $38^{th}$ row. A parity bit $P_{114}$ value in the same $38^{th}$ row can be acquired in a state that the parity bit $P_{76}$ value is figured out. At this time, the parity bit $P_{114}$ has a $72^{th}$ row value.

A parity bit $P_{418}$ value in a $380^{th}$ row is acquired through the parity bit calculating procedure described above. The acquired parity bit $P_{418}$ value becomes a parity bit $P_{418}$ value in a $418^{th}$ row.

As described above, when a value acquired by summating an input bit and a parity bit corresponding to the $418^{th}$ row is 0, values of parity bits "$P_0, P_{38}, P_{76}, P_{114}, P_{152}, P_{190}, P_{228}, P_{266}, P_{304}, P_{418}$" are determined as right values. On the other hand, when the value acquired by summating the input bit and the parity bit corresponding to the $418^{th}$ row is not 0, an initial value of the parity bit $P_0$ is set up as 1 according to the initial procedure, e.g., the procedure of setting up the initial value of the parity bit $P_0$ in advance, and a next procedure is performed.

A procedure of checking whether the parity bit value on the matrix is right while changing the initial value of the parity bit $P_0$ may increase an operation quantity. As another example, it is preferred that a final parity bit is determined by performing an exclusive OR (XOR) operation on "$P_0, P_{38}, P_{76}, P_{114}, P_{152}, P_{190}, P_{228}$" values among the parity bits "$P_0, P_{38}, P_{76}, P_{114}, P_{152}, P_{190}, P_{228}, P_{266}, P_{304}, P_{418}$".

In addition, "$P_{266}, P_{304}, P_{418}$" among the parity bits are excluded from the XOR operation since the "$P_{266}, P_{304}, P_{418}$" values are not changed. That is, 3 parity bits are determined in a $228^{th}$ row. It is applied that when an odd number of $1^{st}$ and $2^{nd}$ parity bits are determined, a rest $3^{rd}$ parity bit has a regular value.

The procedure of determining the parity bit of the bit identity in accordance with the present invention will be described above. A procedure of determining a parity bit in parallel at a time on the basis of sub-block identity in the present invention will be described in detail with reference to FIGS. 6 and 7.

Figure 6:
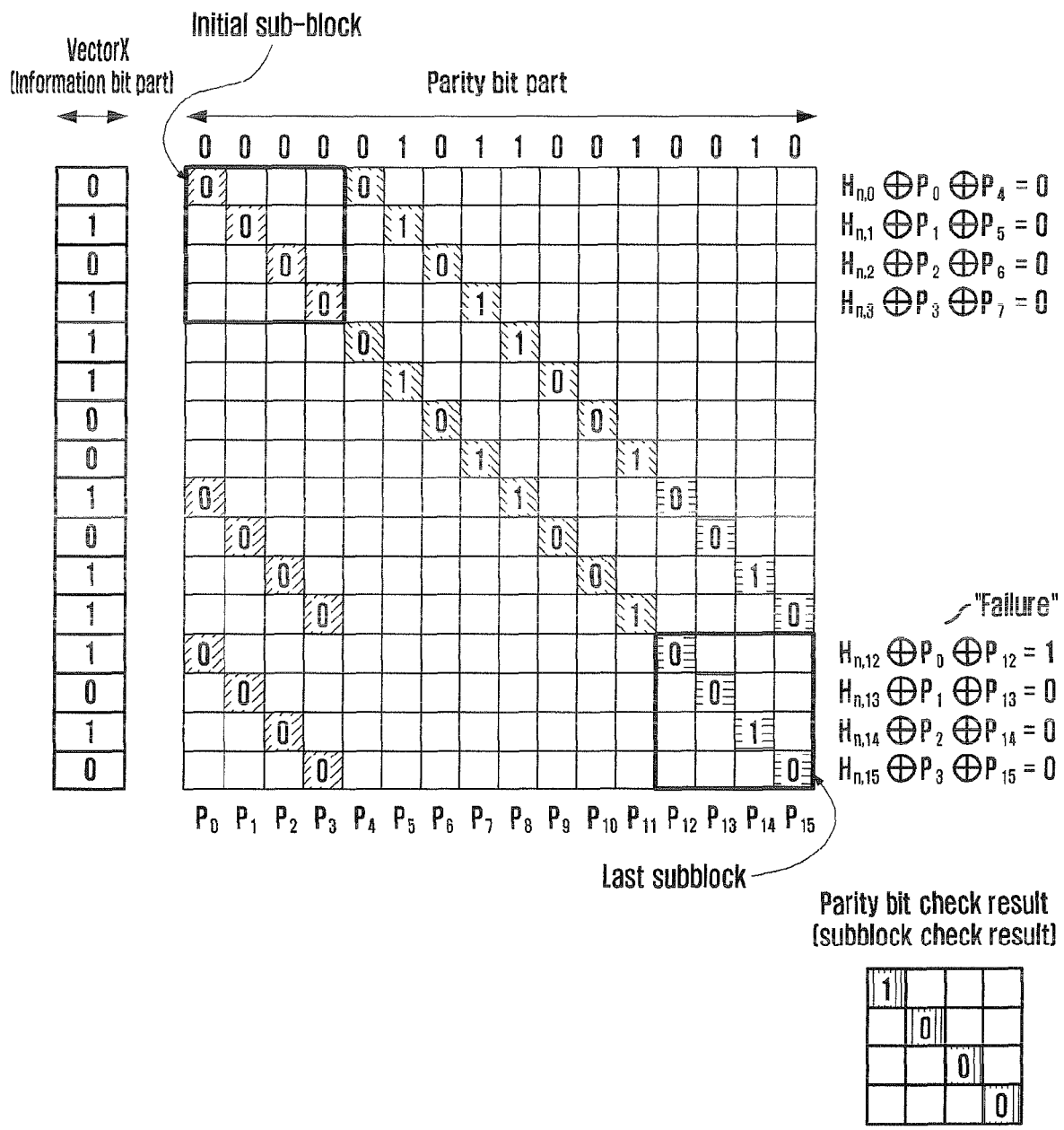
FIG. 6 shows a case that the parity check result is a failure in an operation result of the parity part matrix of the H matrix in accordance with an embodiment of the present invention.

FIG. 6 shows a case that the parity check result is a failure in an operation result of the parity part matrix of the H matrix in accordance with an embodiment of the present invention.

Figure 7:
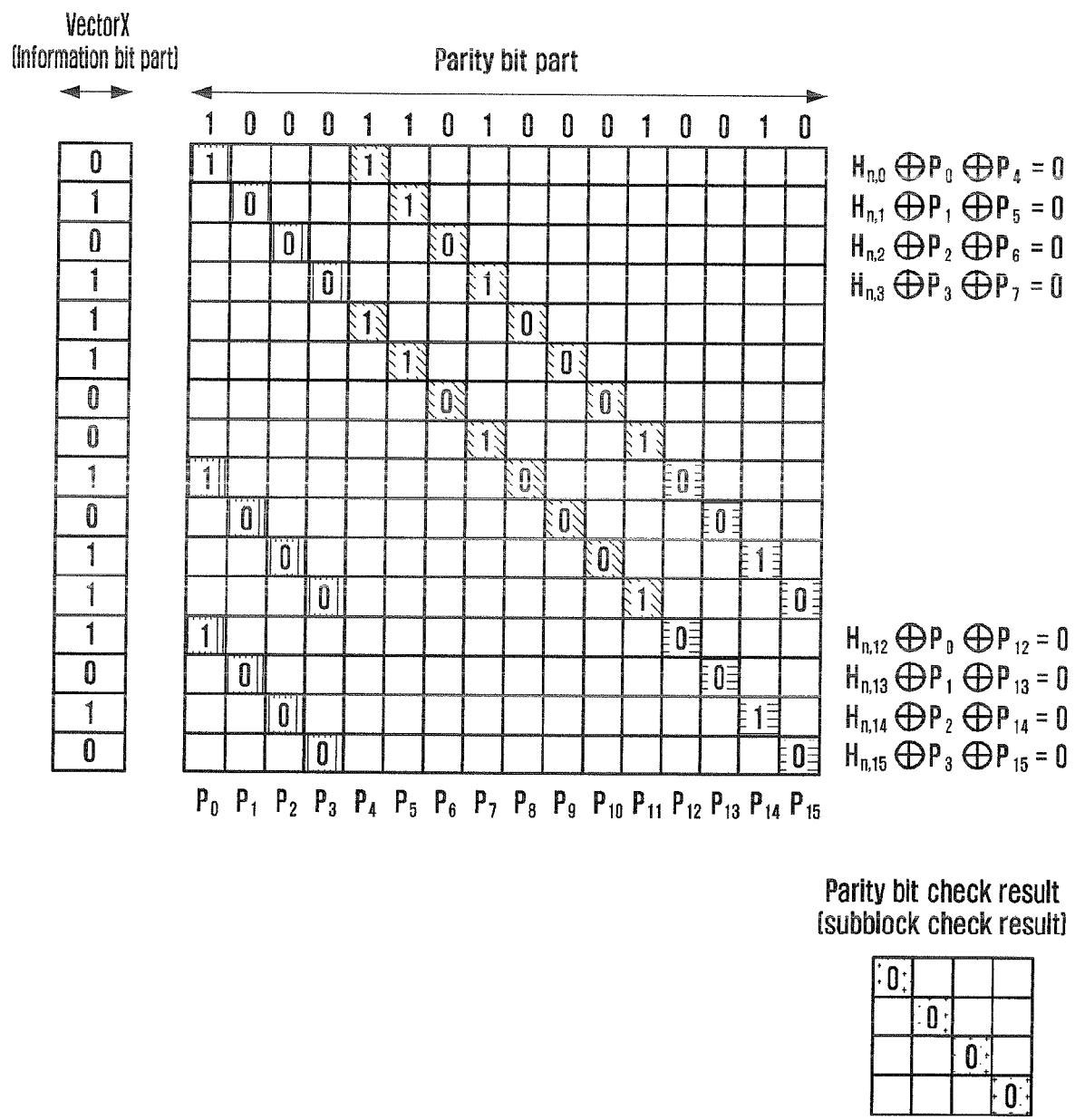
FIG. 7 shows a case that a final parity bit is determined by correcting a parity check result according to the XOR operation in the operation result of the parity part matrix of the H matrix in accordance with an embodiment of the present invention.

FIG. 7 shows a case that a final parity bit is determined by correcting a parity check result according to the XOR operation in the operation result of the parity part matrix of the H matrix in accordance with an embodiment of the present invention. The H matrix includes sub-blocks of 4×4 identity.

In the procedure of determining the parity bit of the bit identity described above with reference to FIG. 4, the present invention can determine the parity bits in parallel at a time on the basis of sub-block identity. That is, when parity bits "$P_0, P_{37}$" are determined, the present invention determines the parity bits "$P_0$" to "$P_{37}$" directly through a parallel process of the sub-block identity.

Referring to FIGS. 6 and 7, an information bit part of the H matrix is a vector X as shown in FIG. 3. The vector X is expressed as the modulo 2 operation. A $0^{th}$ row part on the H matrix of FIG. 4 with respect to the vector X is expressed as shown in Equation 4.

$$(x)_{j=0} = s_{13} \oplus s_{59} \oplus s_{112} \oplus s_{184} \oplus s_{308} \oplus p_0 \oplus p_{38} \qquad \text{Eq. 4}$$

In Equation 4, j represents a $j^{th}$ row of the vector X. In order to apply the H matrix of FIG. 4 to the LDPC code encoder, a vector X value corresponding to the 456 parity bits is created based on Equation 4.

In a state that the vectors X are created based on Equation 4, when it is assumed that the sub-block matrix size on the H matrix is 4×4, an LDPC code encoding procedure is as shown in FIG. 6. Referring to FIG. 6, columns of the $1^{st}$ sub-block of the parity bit part expressed as "▨" are initialized as 0. It means that parity bits "$P_0, P_1, P_2, P_3$" are set up as 0.

As described above with reference to FIG. 4, parity bits "$P_4, P_5, P_6, P_7$" are respectively acquired as "0, 1, 0, 1" through Equation 1. Subsequently, parity bits "$P_8, P_9, P_{10}, P_{11}$" and parity bits "$P_{12}, P_{13}, P_{14}, P_{15}$" are sequentially acquired.

A parity check result for the finally acquired parity bits ranging from $12^{th}$ row to $15^{th}$ row, i.e., Equation 1, is shown as sub-blocks expressed as "▥" in FIG. 6, i.e., a sub-block check result.

When there is a part, which is not 0 such as 1, among the sub-blocks expressed as "▥" of FIG. 6, a parity check result for the predetermined initial sub-block "▨" means a failure in creating the desired LDPC code, i.e., does not satisfy Equation 1. In FIG. 6, a parity bit of a $12^{th}$ row is a wrongly described.

Since the parity check result is the failure in FIG. 6, a final parity bit should be determined through correction. This procedure is shown in FIG. 7. That is, an XOR operation is performed on the parity check result of FIG. 6, i.e., the sub-block expressed as "▥" in FIG. 6, with the sub-block of the parity bit part expressed as "▨" and the sub-block of the parity bit part expressed as "▩" in FIG. 6.

A result of FIG. 7 is acquired as the XOR operation result. In particular, when the parity bit check is performed on the 12$^{th}$ to 15$^{th}$ rows, a sub-block expressed as "▪" of FIG. 7 is acquired. That is, FIG. 7 shows that parity bits "$P_0$" to "$P_{15}$" satisfying Equation 1 are finally acquired.

When the final parity bits are determined described above, the parity bit part expressed as "▤" in FIG. 7 should be excluded from the object of the XOR operation. The reason that the parity bit part expressed as "▤" in FIG. 7 should be excluded from the object of the XOR operation is checked through a procedure that the H matrix of FIG. 6 is corrected into the H matrix of FIG. 7. Although sub-block values of the parity part expressed as "▥" in FIG. 6, the parity part expressed as "▩" in FIG. 6, the parity part expressed as "▥" in FIG. 7, and the parity part expressed as "▩" in FIG. 7 are changed, the sub-block value of the parity bit part expressed as "▤" of FIG. 6 is not changed. As described above with reference to FIG. 4, the above method is applied to determining 3 parity bits in the procedure of determining the parity bit on the basis of bit identity in the same manner as the procedure of determining the parity bit in parallel on the basis of sub-block identity.

The parity bit determining procedure suggested in the present invention has characteristics that the parity bit is determined in parallel on the basis of sub-block identity and columns corresponding to the parity part expressed as "▥" in FIG. 7 may have the same cyclic shift since it does not affect the LDPC code encoding. It will be described with reference to FIG. 8.

Figure 8:
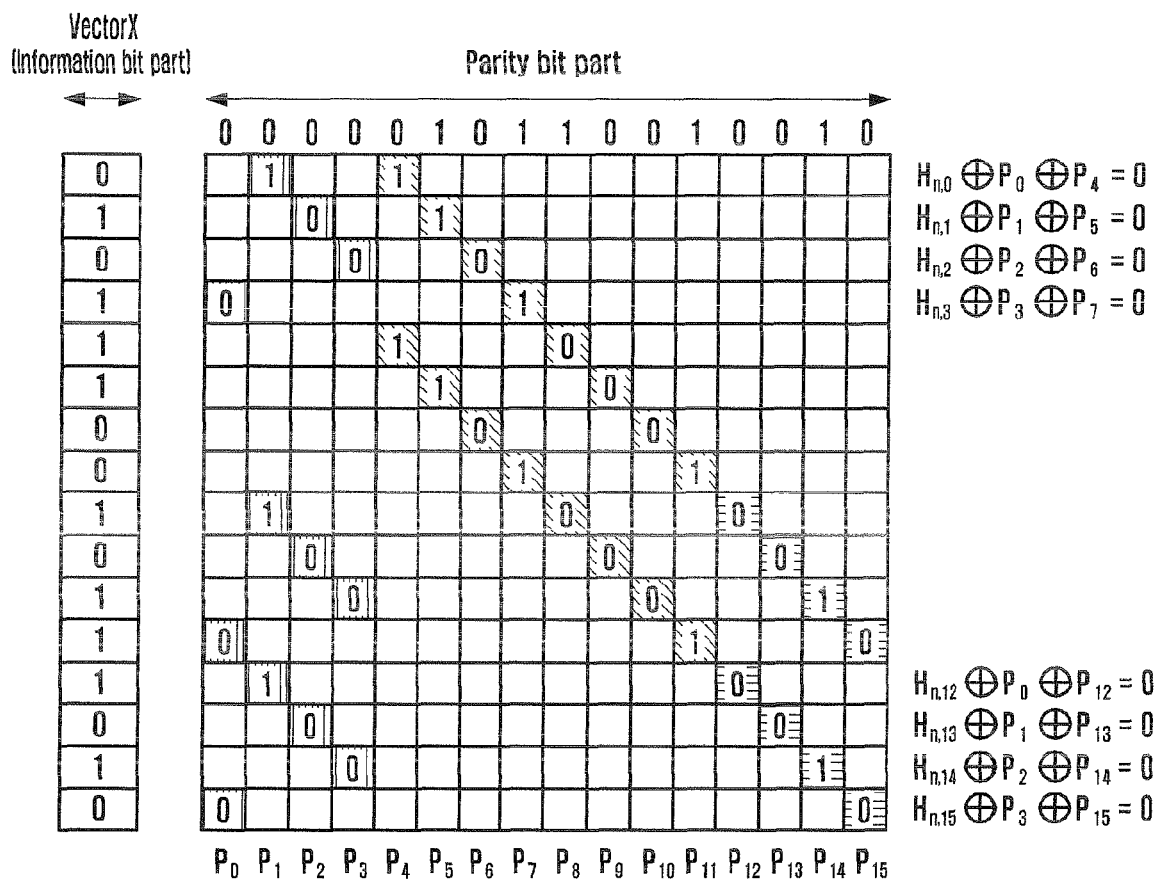
FIG. 8 shows an operation result of the parity part matrix of the H matrix when cyclic shift is performed on the $1^{st}$ column on the H matrix in accordance with an embodiment of the present invention.

FIG. 8 shows an operation result of the parity part matrix of the H matrix when cyclic shift is performed on the 1$^{st}$ column on the H matrix in accordance with an embodiment of the present invention.

FIG. 8 shows a case that 1 cyclic shift is performed on the 1$^{st}$ column. The columns corresponding to the parity part expressed as "▥" have the same cyclic shift. Although the cyclic shift affects the LDPC code encoding performance, the same result is acquired in the LDPC code encoding procedure in accordance with the present invention described above.

Figure 9:
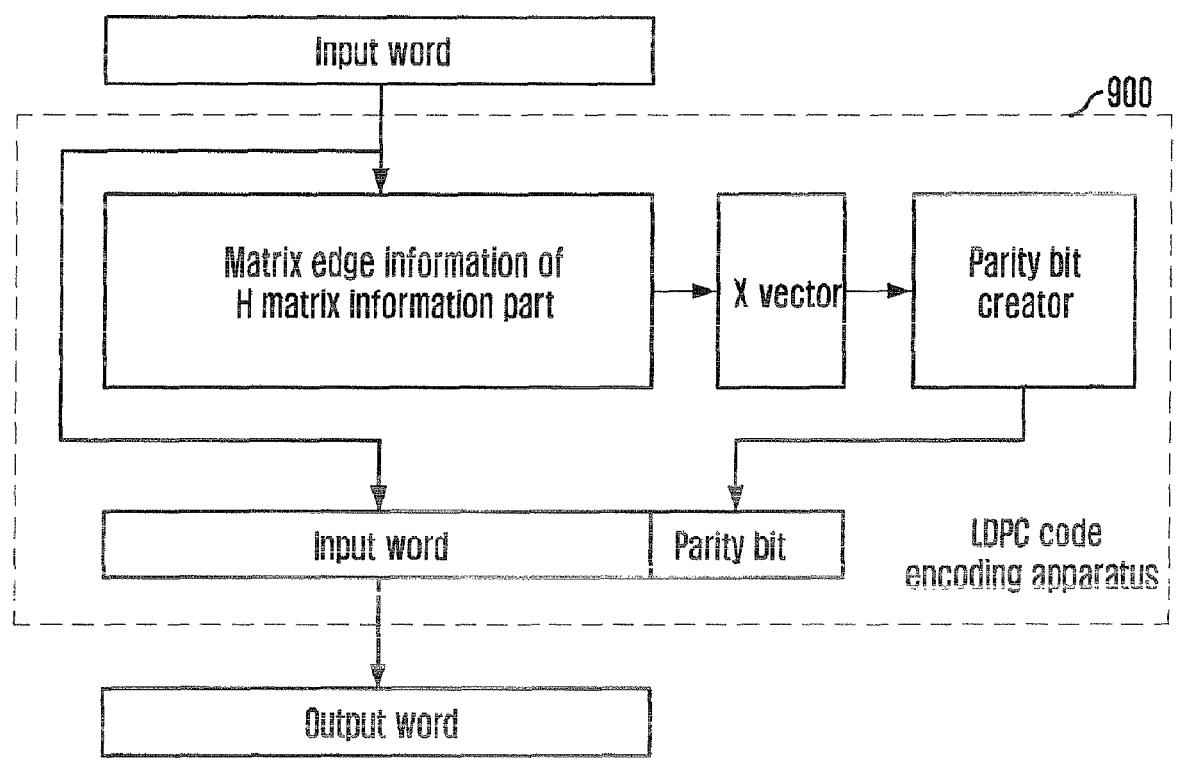
FIG. 9 is a block diagram showing a general LDPC code encoding apparatus in accordance with an embodiment of the present invention.

FIG. 9 is a block diagram showing a general LDPC code encoding apparatus in accordance with an embodiment of the present invention.

As shown in FIG. 9, a general LDPC code encoding apparatus 900 receives an input word and acquires an X vector based on the H matrix. The LDPC code encoding apparatus 900 creates a parity bit based on the X vector. The LDPC code encoding apparatus 900 creates an output word by combining a parity bit and an input word.

At this time, the LDPC code encoding apparatus 900 should perform a matrix operation based on the H matrix to perform encoding according to the LDPC code encoding method described above. That is, the LDPC code encoding apparatus 900 should perform the matrix operation in the procedures of acquiring the X vector and creating the parity bit.

An LDPC code encoding method using a message passing algorithm between a variable node and a check node of the LDPC code decoding apparatus, which does not use the matrix operation differently from the LDPC code encoding apparatus of FIG. 9, will be described.

Figure 10A:
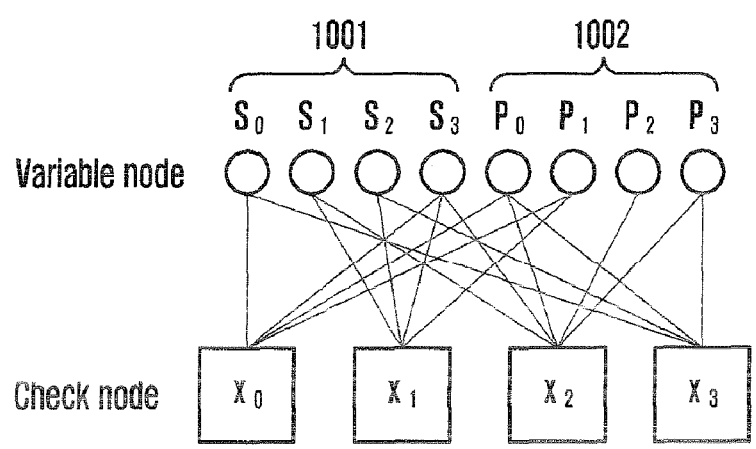
FIG. 10A shows the message passing algorithm in the LDPC code decoding apparatus.

FIG. 10A shows the message passing algorithm in the LDPC code decoding apparatus. The LDPC code encoding method is basically based on the message passing algorithm of the LDPC code decoding apparatus. The LDPC code decoding apparatus may be realized according to the simple method such as a minimum-sum algorithm.

As shown in FIG. 10A, the LDPC code decoding apparatus includes a variable node and a check node. The check node acquires an X vector 1003 by performing a function of accumulating a bit as shown in Equation 4. That is, the check node acquires the X vector 1003 by accumulating an input bit 1001 and a parity bit 1002 stored in the variable node. The LDPC code decoding apparatus basically performs the message passing algorithm according to Equations 5 and 6 as follows:

$$\text{sgn}(x_j) = \prod_{i=0}^{N-1} \text{sgn}(Z_i) \qquad \text{Eq. 5}$$

where $Z_i$ represents an i$^{th}$ Log Likelyhood Ratio (LLR) and $X_j$ represents a j$^{th}$ check node value. That is, the code of the check node value means a result acquired by multiplying codes of the LLR "$Z_i$" corresponding to each j$^{th}$ row, i.e., columns i.

The offset minimum summation LDPC code decoding apparatus searches the minimum value in the LLR "$Z_i$" of each column and subtracts a predetermined offset value "c" from the minimum value. It is simply expressed as Equation 6.

$$|x_j| = \min_{i=0}^{N-1} |Z_i| - c \qquad \text{Eq. 6}$$

where "c" represents offset and is a generally small value. For example, performance is improved by controlling the offset "c" by 0.5.

Figure 10B:
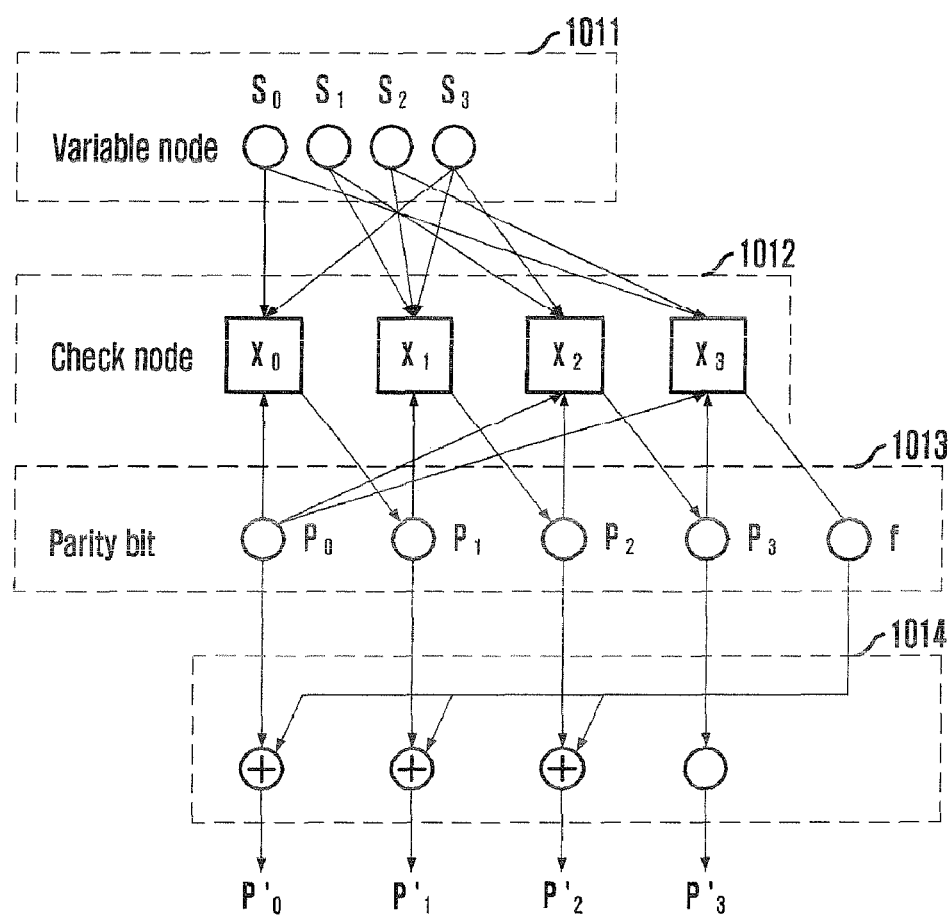
FIG. 10B shows an LDPC code encoding procedure using a message passing algorithm in accordance with an embodiment of the present invention.

FIG. 10B shows an LDPC code encoding procedure using a message passing algorithm in accordance with an embodiment of the present invention. As shown in FIG. 10B, the LDPC code encoding method adopts the message passing algorithm shown in FIG. 10A.

When the LDPC code encoding procedure in accordance with the present invention is described in detail, input bits $s_0$, $s_1$, $s_2$, and $s_3$ are stored in a variable node 1011. Predetermined parity bits $p_0$, $p_1$, $p_2$, and $p_3$ are input in advance and stored in a parity bit 1013.

A check node value $x_0$ is acquired through message passing between the variable node 1011 storing the 1$^{st}$ input bit and a check node 1012. That is, when the predetermined designated parity bit $p_0$ and input bits $s_0$ and $s_3$ are substituted for Equations 5 and 6, a minimum value is determined. The check node value $x_0$ is acquired by applying offset to the minimum value.

A next parity bit $p_1$ is acquired based on the check node value $x_0$. That is, the check node values $x_0$, $x_1$, $x_2$ and $x_3$ are sequentially acquired according to the message passing algorithm where offset is applied and the parity bit values $p_0$, $p_1$, $p_2$, and $p_3$ are sequentially acquired. Also, a code of the check node value $x_0$ from the last check node value $x_3$ is stored in an "f" term.

Final parity bits $p_0'$, $p_1'$, and $p_2'$ are acquired by performing an XOR operation on the sequentially acquired parity bits $p_0$, $p_1$, and $p_2$ with the code "f" of the check node value $x_0$. The XOR operation with the code "f" of the check node value $x_0$ is not performed on the last parity bit $p_3$.

Figure 11:
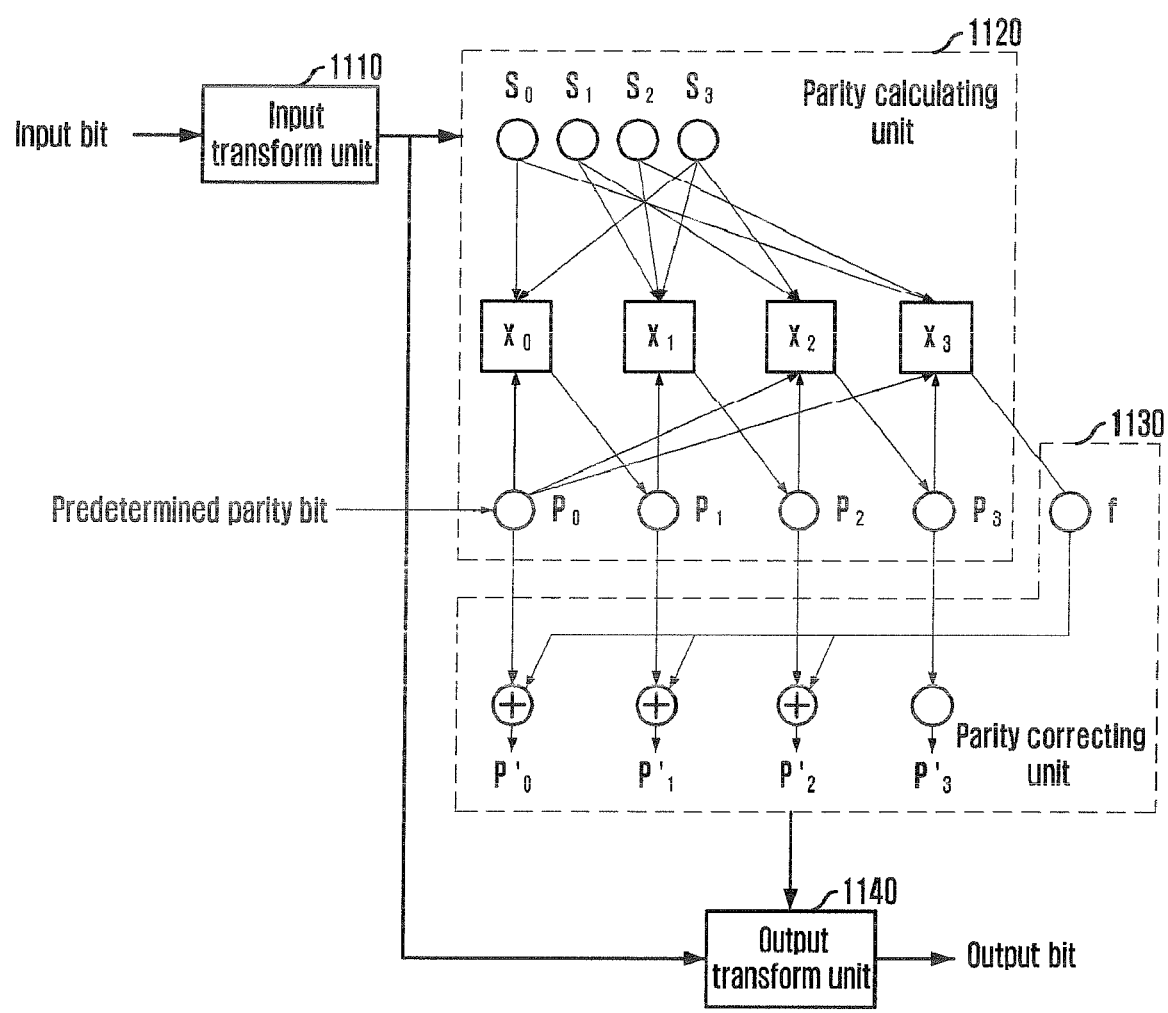
FIG. 11 is a block diagram showing the LDPC code encoding apparatus using the message passing algorithm in accordance with an embodiment of the present invention.

FIG. 11 is a block diagram showing the LDPC code encoding apparatus using the message passing algorithm in accordance with an embodiment of the present invention. The LDPC code encoding apparatus in accordance with the present invention includes an input transform unit 1110, a parity calculating unit 1120, a parity correcting unit 1130 and an output transform unit 1140.

The input transform unit 1110 transforms a binary format of the input bit into a decimal format having a code. That is, the input transform unit 1110 transforms the binary format of the input bits $s_0$, $s_1$, $s_2$, and $s_3$ input from outside into the decimal format and transmits the input bits $s_0$, $s_1$, $s_2$, and $s_3$ of the decimal format to the parity calculating unit 1120.

The parity calculating unit 1120 receives the input bits $s_0$, $s_1$, $s_2$, and $s_3$ transformed into the input bits of the decimal format in the input transform unit 1110 and receives a predetermined parity bit from outside. The parity calculating unit 1120 calculates the check node values $x_0$, $x_1$, $x_2$, and $x_3$ on the input bits $s_0$, $s_1$, $s_2$, and $s_3$ and the predetermined designated parity bit according to the message passing algorithm by applying offset. That is, the parity calculating unit 1120 sequentially calculates the check node values $x_0$, $x_1$, $x_2$, and $x_3$ by applying offset to an absolute minimum value and code multiplication according to the message passing algorithm where offset is applied. The parity calculating unit 1120 calculates a parity bit from the check node value. At this time, the parity calculating unit 1120 calculates a parity bit by applying different offset values according to a decimal point expressing method of the parity bit.

The parity correcting unit 1130 corrects the parity bit based on the bit value code of the parity bit calculated in the parity calculating unit 1120. That is, the parity correcting unit 1130 stores the code of the calculated last check node value. The parity correcting unit 1130 corrects the parity bit by performing the XOR operation with the parity bit calculated in the parity calculating unit 1120 based on the code. The last parity bit does not perform the XOR operation.

The output transform unit 1140 combines the input bit transformed in the input transform unit 1110 and the parity bit finally calculated in the parity correcting unit 1130. The output transform unit 1140 transforms the code of the combined decimal format into a code of the binary format.

An example of the LDPC code encoding apparatus in accordance with the present invention will be described with reference to Table 1.

TABLE 1

| | S0 | S1 | S2 | S3 | P0 | P1 | P2 | X3 | X |
|---|---|---|---|---|---|---|---|---|---|
| Initial value | +7 | | | −7 | +7 | ∞ | ∞ | ∞ | X0 = +7 |
| t = 0 | +7 | | | −7 | +7 | X1 | | | X1 = −6 |
| t = 1 | | +7 | +7 | −7 | | | −6 | X2 | X2 = +5 |
| t = 2 | | +7 | | −7 | +7 | | | +5 | X3, X3 = −4 |
| t = 3 | | | | | ∞ | | | | |
| t = 4 | +7 | | +7 | | −3 | | | −4 | X0 = −3 |
| Output | | | | | −3 | +6 | −5 | −4 | |
| Binary number output | | | | | 1 | 0 | 1 | 1 | |
| | | | | | X0 | X1 | X2 | X3 | |

For example, as shown in Table 1, the binary format of the input bit should be transformed into a signed decimal format in order to apply the message passing algorithm of the LDPC code decoding apparatus to the present invention.

Assuming that the input bits $s_0$, $s_1$, $s_2$, $s_3 = \{0, 0, 0, 1\}$, the input bits will be corrected. The input transform unit 1110 transforms the format of the input bits from the binary format into $s_0$, $s_1$, $s_2$, $s_3$, $p_0$, $p_1$, $p_2$, $p_3 = \{+7, +7, +7, -7, +7, \infty, \infty, \infty\}$ as the signed decimal format. It is assumed that an LLR bit width of the LDPC decoding apparatus is 4 bits. The values of the parity bits $p_1$, $p_2$, and $p_3$ are not determined and are initialized to infinity.

The parity calculating unit 1120 receives input bits $\{+7, +7, +7, -7\}$ transformed into the decimal format in the input transform unit 1110 and receives predetermined parity bits $\{+7, \infty, \infty, \infty\}$. The parity calculating unit 1120 calculates check node values $\{x_0, x_1, x_2, x_3\}$ based on input bits $\{+7, +7, +7, -7, +7\}$ and the predetermined parity bits $\{+7, \infty, \infty, \infty\}$.

A check node "$x_0$" connects input bits "$s_0$" and "$s_3$" to block parity blocks "$p_0$" and "$p_1$". However, the check node "$x_0$" connects the input bits "$s_0$" and "$s_3$" only to the parity block "$p_0$" in an initial state.

Therefore, a code multiplication result of the check node "$x_0$" has a "+" value by Equation 5. Since the minimum value of the check node "$x_0$" is 7 based on Equation 6, a value "+7" is stored in the check node "$x_0$". The parity calculating unit 1120 calculates the value of the check node "$x_0$" as "+7". A check node "$x_1$" becomes a node of connecting the input bits "$s_1$" and "$s_2$" to the parity blocks "$p_1$" and "$p_2$".

When t=0, a code of "$p_1$" is a negative number and the minimum value of "$p_1$" is 7. Since the offset minimum value is applied, the parity calculating unit 1120 acquires a calculation value "6" by subtracting "1" which is the offset value "c", from "7". It is assumed that the offset value "c" is "1" when the LLR value is realized as a fixed point and the offset value "c" is "0.5" when the LLR value is a floating value. Accordingly, the result value of the final "$x_1$" check node is "−6".

As described above, the parity calculating unit 1120 repeats the calculation on "$x_2$". It is characteristic that a check node value of "$x_0$" is initialized to infinity when t=3.

When t=4, the parity calculating unit 1120 performs a decoding operation again. That is, the parity calculating unit 1120 initializes the $1^{st}$ check node value to infinity and calculates the $1^{st}$ bit value "$p_0$" of the parity bit according to the message passing algorithm. The result is different from the calculation result of the above check node and the code of the check node "$x_0$" is stored in the "f" term by the parity correcting unit 1130. The parity bit has a code changed by the "f" term and has corrected values "$P_0$'", "$p_1$'", and "$P_2$'".

The final LLR values are as shown in "$s_0$, $s_1$, $s_2$, $s_3$, $p_0$, $p_1$, $p_2$, $p_3$" = $\{+7, +7, +7, -7, -3, +6, -5, -4\}$. The output transform unit 1140 transforms the format of the LLR values into the binary format and acquires final LDPC encoding output values as "$s_0$, $s_1$, $s_2$, $s_3$, $p_0'$, $p_1'$, $p_2'$, $p_3'$" = $\{0, 0, 0, 1, 1, 0, 1, 1\}$.

Figure 12:
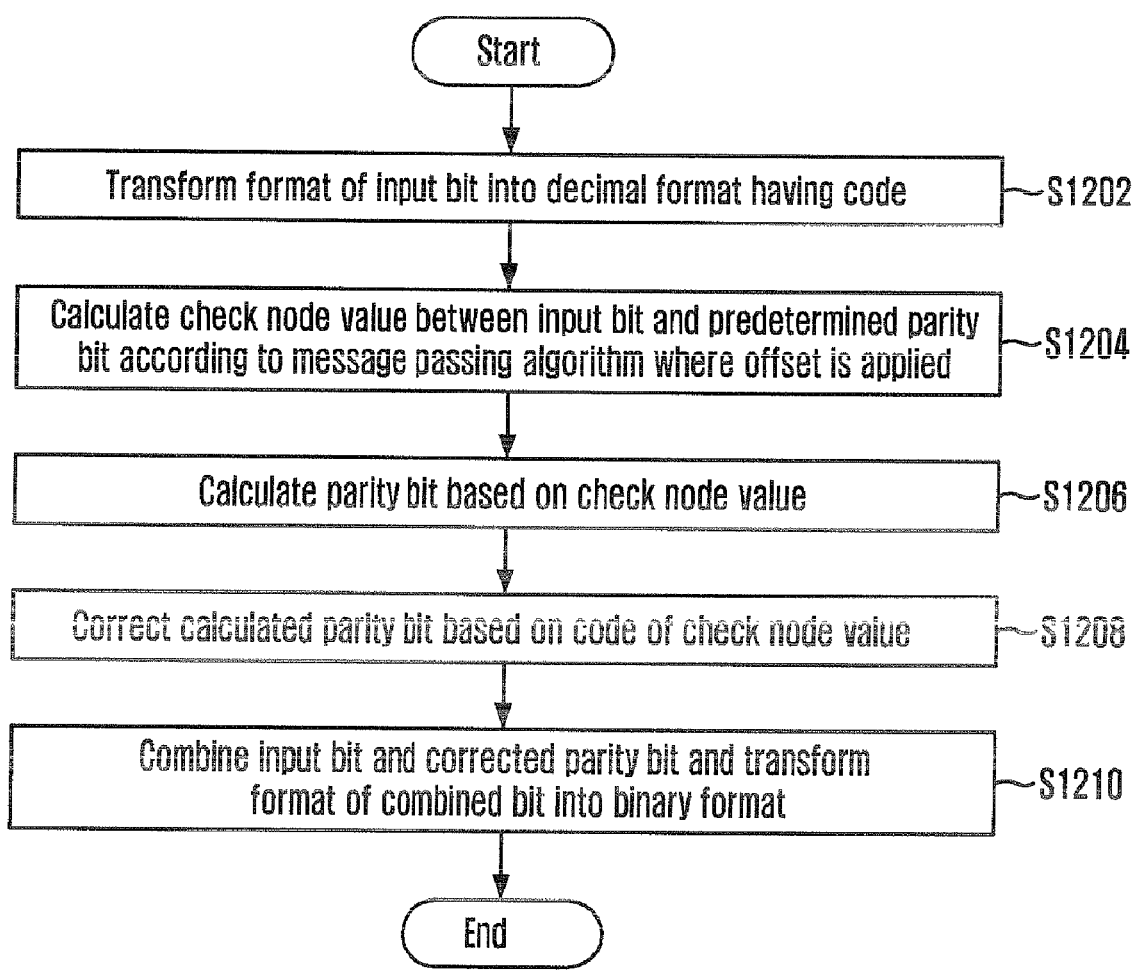
FIG. 12 is a flowchart describing an LDPC code encoding method using the message passing algorithm in accordance with an embodiment of the present invention.

FIG. 12 is a flowchart describing an LDPC code encoding method using the message passing algorithm in accordance with an embodiment of the present invention.

The input transform unit 1110 transforms the format of the input bits $s_0$, $s_1$, $s_2$, and $s_3$ such as a binary format into a decimal format having a code at step S1202.

The parity calculating unit 1120 calculates the check node values $x_0$, $x_1$, $x_2$, and $x_3$ on the input bits $s_0$, $s_1$, $s_2$, and $s_3$ and the predetermined parity bit by applying offset according to the message passing algorithm at step S1204. That is, the parity calculating unit 1120 sequentially calculates the check node values $x_0$, $x_1$, $x_2$, $x_3$ by applying offset to the absolute minimum value and code multiplication according to the message passing algorithm where offset is applied. The parity calculating unit 1120 calculates the parity bit based on the check node value at step S1206. The parity calculating unit 1120 calculates the parity bit by applying different offset values according to the decimal point expressing method of the parity bit.

The parity correcting unit 1130 corrects the calculated parity bit based on the code of the check node value at step S1208. That is, the parity correcting unit 1130 corrects the parity bit by performing an XOR operation with the parity bit calculated in the parity calculating unit 1120 based on the code of the lastly calculated check node value. The XOR operation is not performed on the last parity bit. The output transform unit 1140 combines the input bit and the corrected parity bit and transforms the format of the combined bit into the binary format at step S1210.

The present invention can remarkably reduce hardware complexity of the conventional LDPC encoding apparatus by designating a predetermined parity bit and calculating a check node value and a parity bit using the message passing algorithm where offset of the LDPC code decoding procedure is applied.

Also, the present invention can apply the parallel process structure based on the quasi-cyclic LDPC code which is easily processed at high-speed.

The present invention can also minimize hardware resources by correcting and organizing hardware of the decoding apparatus in a hardware format of the encoding apparatus.

As described above, the technology of the present invention can be realized as a program. A code and a code segment forming the program can be easily inferred from a computer programmer of the related field. Also, the realized program is stored in a computer-readable recording medium, i.e., information storing media, and is read and operated by the computer, thereby realizing the method of the present invention. The recording medium includes all types of recording media which can be read by the computer.

While the present invention has been described with respect to the specific embodiments, it will be apparent to those skilled in the art that various changes and modifications may be made without departing from the spirit and scope of the invention as defined in the following claims.

What is claimed is:

1. An apparatus for encoding a Low Density Parity Check (LDPC) code using a message passing algorithm, comprising:
a parity calculating hardware unit for calculating a check node value based on an input bit and a predetermined parity bit according to the message passing algorithm, and calculating a parity bit based on the calculated check node value;
a parity correcting hardware unit for correcting the calculated parity bit according to a parity check result of the calculated parity bit; and
an output transform hardware unit for combining the input bit and the corrected parity bit.

2. The apparatus of claim 1, further comprising:
an input transform hardware unit for transforming a format of the input bit into a decimal format having a code and transmitting the input bit to the parity calculating hardware unit, and
wherein the output transform hardware unit transforms the format of the combined parity bit into a binary format.

3. The apparatus of claim 1, wherein the parity calculating hardware unit calculates the check node value based on the input bit and the predetermined parity bit according to the message passing algorithm where an offset is applied.

4. The apparatus of claim 3, wherein the parity calculating hardware unit calculates the check node value by applying offset to an absolute minimum value and code multiplication of the input bit and the predetermined parity bit.

5. The apparatus of claim 4, wherein the parity calculating hardware unit initializes a 1st bit value of the parity bit to infinity and calculates the 1st bit value of the parity bit according to the message passing algorithm.

6. The apparatus of claim 5, wherein the parity calculating hardware unit calculates the parity bit by applying different offset values according to a decimal point expressing method of the parity bit.

7. The apparatus of claim 1, wherein the parity correcting hardware unit corrects the parity bit based on a bit value code of the calculated parity bit.

8. The apparatus of claim 7, wherein the parity correcting hardware unit performs an exclusive OR (XOR) operation on a rest bit value excluding a last bit value of the calculated parity bit with a 1st bit value code of the calculated parity bit.

9. The apparatus of claim 8, wherein the predetermined parity bit includes the 1st bit value designated as a constant and the rest bit value initialized to infinity.

10. A method for encoding a Low Density Parity Check (LDPC) code using a message passing algorithm in an LDPC code encoding apparatus, comprising:
calculating a check node value based on an input bit and a predetermined parity bit according to a message passing algorithm, and calculating a parity bit based on the calculated check node value;
correcting the calculated parity bit according to a parity check result of the calculated parity bit; and
combining the input bit and the corrected parity bit.

11. The method of claim 10, further comprising:
transforming a format of the input bit into a decimal format having a code, and
wherein the combining the input bit and the corrected parity bit comprises transforming the combined parity bit into a parity bit of a binary format.

12. The method of claim 10, wherein the calculating the check node value comprises calculating the check node value based on the input bit and the predetermined parity bit according to the message passing algorithm where an offset is applied.

13. The method of claim 12, wherein the check node value is calculated by applying offset to an absolute minimum value and code multiplication of the input bit and the predetermined designated parity bit.

14. The method of claim 13, wherein a 1st bit value of the parity bit is initialized to infinity and the 1st bit value of the parity bit is calculated according to the message passing algorithm.

15. The method of claim 14, wherein the parity bit is calculated by applying different offset values according to a decimal point expressing method of the parity bit.

16. The method of claim 10, wherein the parity bit is corrected based on a bit value code of the calculated parity bit.

17. The method of claim 16, wherein an exclusive OR (XOR) operation is performed on a rest bit value excluding a last bit value of the calculated parity bit with a 1st bit value code of the calculated parity bit.

* * * * *